(12) United States Patent
Bokatius et al.

(10) Patent No.: US 7,683,480 B2
(45) Date of Patent: Mar. 23, 2010

(54) METHODS AND APPARATUS FOR A REDUCED INDUCTANCE WIREBOND ARRAY

(75) Inventors: Mario M. Bokatius, Tempe, AZ (US);
Peter H. Aaen, Phoenix, AZ (US);
Brian W. Condie, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 358 days.

(21) Appl. No.: 11/393,582

(22) Filed: Mar. 29, 2006

(65) Prior Publication Data

US 2007/0235855 A1    Oct. 11, 2007

(51) Int. Cl.
*H01L 23/24* (2006.01)
(52) U.S. Cl. ............... 257/728; 257/693; 257/E23.141
(58) Field of Classification Search ............... 257/728, 257/693, E23.141
See application file for complete search history.

(56) References Cited

U.S. PATENT DOCUMENTS

| | | | | |
|---|---|---|---|---|
| 3,753,056 A * | 8/1973 | Cooke | .......................... | 257/664 |
| 3,784,883 A * | 1/1974 | Duncan et al. | .............. | 257/664 |
| 3,784,884 A * | 1/1974 | Zoroglu | ...................... | 257/664 |
| 3,958,195 A * | 5/1976 | Johnson | ...................... | 333/247 |
| 4,042,952 A * | 8/1977 | Kraybill | ...................... | 257/724 |
| 4,092,664 A * | 5/1978 | Davis, Jr. | .................... | 257/664 |
| 4,393,392 A * | 7/1983 | Hale | ........................... | 257/664 |
| 4,427,991 A * | 1/1984 | Yamamura et al. | .......... | 257/664 |
| 5,057,805 A * | 10/1991 | Kadowaki | .................... | 333/247 |
| 5,598,038 A * | 1/1997 | Sugano | ........................ | 257/787 |
| 5,977,619 A * | 11/1999 | Uemura | ....................... | 257/676 |
| 6,072,211 A * | 6/2000 | Miller et al. | ................. | 257/308 |
| 6,097,612 A * | 8/2000 | Ishikawa et al. | ............. | 361/794 |
| 6,162,653 A * | 12/2000 | Maund | ........................ | 438/27 |
| 6,511,866 B1* | 1/2003 | Bregante et al. | ............. | 438/127 |
| 6,631,257 B1* | 10/2003 | White et al. | ................. | 455/333 |
| 2001/0001158 A1* | 5/2001 | Tetrick | ........................ | 714/763 |
| 2002/0163018 A1* | 11/2002 | Kamiya | ....................... | 257/208 |
| 2003/0038292 A1* | 2/2003 | Wang et al. | ..................... | 257/81 |
| 2003/0098506 A1* | 5/2003 | Haraguchi et al. | .......... | 257/735 |
| 2005/0017352 A1 | 1/2005 | Lee | | |

* cited by examiner

*Primary Examiner*—A. Sefer
*Assistant Examiner*—Allen L. Parker
(74) *Attorney, Agent, or Firm*—Ingrassia, Fisher & Lorenz, P.C.

(57) ABSTRACT

A wirebond array (100) comprising a plurality of signal wires 110 and a plurality of ground wires (120) interdigitated with and substantially parallel to the set of signal wires (110). In one embodiment, each of the plurality of signal wires (110) and ground wires (120) is attached to a first semiconductor device (102) (e.g., a microwave power device). In another, each of the plurality of signal wires (110) is further attached to a package lead (104). In one embodiment, each of the plurality of ground wires (120) is further attached to a ground connection region (106) substantially coplanar with the package lead (104). Alternatively, each of the plurality of signal wires (110) is further attached to a second semiconductor device, wherein each of the plurality of ground wires (120) is further attached to the second semiconductor device.

15 Claims, 2 Drawing Sheets

METHODS AND APPARATUS FOR A REDUCED INDUCTANCE WIREBOND ARRAY

FIELD OF THE INVENTION

The present invention generally relates to microelectronic interconnects and, more particularly, to low-inductance wirebond arrays used in connection with, for example, high power microwave devices.

BACKGROUND OF THE INVENTION

High power RF & microwave transistor devices are typically connected to package leads and other electronic components using multiple parallel wires, or "wirebond arrays." While single wires are often modeled as inductors in series with resistors, wirebond arrays are typically modeled as a number of inductors connected in parallel, wherein mutual coupling between wires is factored in to produce a single equivalent inductance.

The input impedance ($Z_{in}$) of high power transistors is typically low (less than approximately 3.0 Ω). At high frequencies (e.g., greater than about 2.0 GHz), it is desirable that the interconnecting input wirebond array be low inductance to enable broadband impedance matching. Reducing impedance is also important, to a lesser extent, at lower frequencies (e.g., broadcast frequencies of about 450 MHz.) If the inductance of the input wirebond array is too large, the quality (Q) of the matching network becomes excessive and broadband impedance matching can no longer be achieved.

The inductance of a wirebond array is a function of wire length, number of wires, wire loop height, and distance between the wires and the ground plane. In most applications, the physical dimensions of the design are predefined (e.g., component size, package size, etc.) and minimum loop height wires are typically already used. Thus, efforts to reduce wirebond array impedance have centered primarily on increasing the number of wires. Increasing the number of wires also increases the size of the device and/or package and requires additional processing steps.

Furthermore, in traditional wirebond arrays, the RF current is increased on the outer wires of the array. The resulting uneven current distribution can lead to an asymmetrical match of the power transistor. Furthermore, this non-symmetrical current can cause non-symmetrical wire temperatures. Wires at the periphery of the array will become hotter than wires toward the middle, and elevated wire temperatures and high-current operation decreases wire lifetime. This problem is expected to be more severe in the future, as devices with greater power densities (e.g., SiC and GaN devices) are developed.

Accordingly, there is a need for wire-bonding schemes that reduce overall inductance and improve current distribution in wirebond arrays. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description. Conventional terms and processes relating to semiconductor processing and packaging are known to those skilled in the art, and are therefore not discussed in detail herein.

Figure 1:
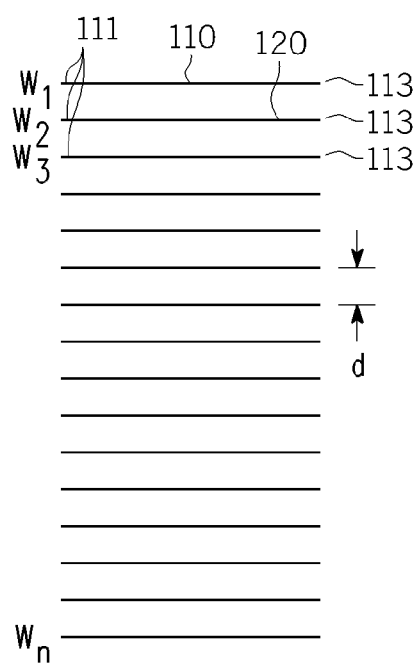
FIG. 1 is a conceptual overview of a wirebond array in accordance with one embodiment.

Referring to the conceptual diagram shown in FIG. 1, a wirebond array in accordance with one embodiment generally includes a series of n wires $w_1, w_2, \ldots, w_n$ interdigitated such that wires $w_i$ (i=1, 3, . . . ) are signal wires (110), and wires $W_j$ (j=2, 4, . . . ) are ground wires (120). Alternating wires 110, 120 are separated by a distance d, which may or may not be uniform across array 100. That is, wires 110 and 120 are preferably substantially parallel and may be evenly spaced. Each wire has two ends (111, 113) which are suitably connected to package leads, matching components, or the like, depending upon the application. In an alternate embodiment, the outermost wires in the array, $w_1$ and $w_n$, are signal wires, as are wires $w_3$, $w_5$, etc., while interdigitated wires $w_2$, $w_4$, etc. are ground wires.

In an alternate embodiment, the array might include two adjacent ground wires alternating with one signal wire, or some other such configuration (e.g., a single ground wire in the center of the array). Furthermore, it might be advantageous to bond more signal wires near the center of the power device. It will be appreciated, therefore, that the illustrated array is merely exemplary, and that the present invention comprehends any suitable wirebond array design. In general, then, the term "interdigitated" as used herein is not intended to limit the embodiments to simple alternating wire patterns: it encompasses any pattern of signal wires configured parallel to at least one ground wire.

The term "ground wire" as used herein refers to a wire that is coupled to a ground node or ground plane at one or more of its ends. The term "signal wire" refers to any wire, not a ground wire, that carries some form of electrical signal. In the illustrated embodiment, for example, the signal wires carry high-frequency signals such as microwave signals.

Figure 2:
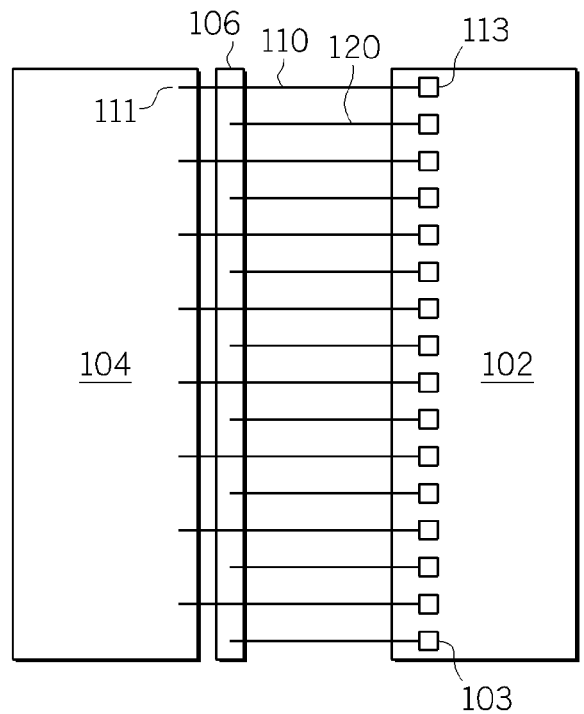
FIG. 2 is a top view of a wirebond array used in accordance with one embodiment.
Figure 3:
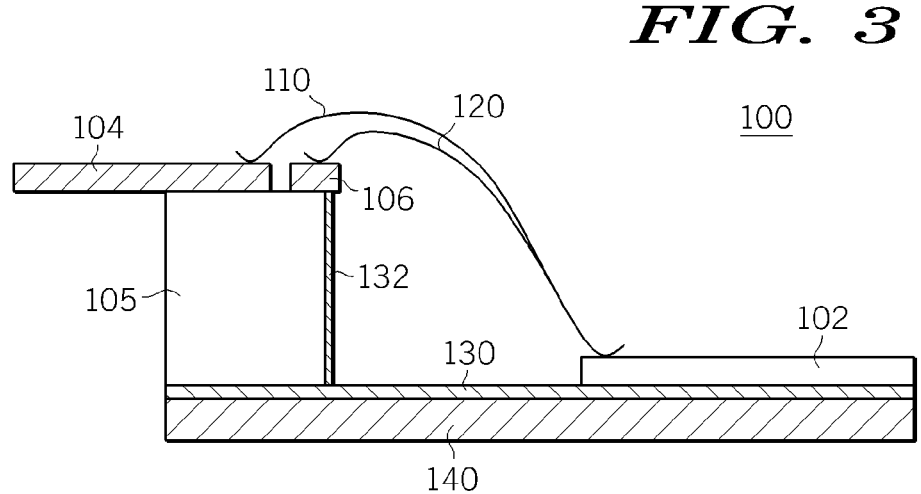
FIG. 3 is a side view of the exemplary wirebond array of FIG. 2.

FIGS. 2 and 3 depict a top view and side view, respectively, of an exemplary wire bond array used to connect a semiconductor device to a package lead. Specifically, wirebond array 100 is used to interconnect a package lead 104 with a device 102 (e.g., an active device or a passive device, typically comprising one or more die). Device 102 has a series of bonding areas (e.g., bond pads) 103, and package lead 104 likewise has a series of bonding areas (or a large contiguous bonding area) 111. Bond wires 110 (the signal wires) extend from respective bond areas 113 to bond areas 111, providing electrical conductivity between device 102 and package lead 104. Similarly, bond wires 120 (the ground wires) extend from bond pad areas 113 to a ground connection region 106. Thus, wirebond array 100 operates as an impedance matching element.

Ground connection region 106 is electrically connected to a ground plane 130 (e.g., via a connector 132), as shown in FIG. 3, corresponding to the top surface of a package flange or other base component 140 Package lead 104 (and substantially coplanar ground connection region 106) are raised above the ground plane 130 of flange 140 via an isolator (e.g., a ceramic window frame) 105.

Connector 132 may be any conductive element formed, deposited, or otherwise provided between region 106 and ground plane 130. Connector 132 might include, for example, vias to ground provided within isolator 105, conductive castellations, or wrap-around metallization (e.g., a refractory tungsten plated with Ni and Au) as known in the art. Thus, package lead 104, isolator 105, and flange 140 together form a shunt capacitor, and wirebond array 100 and isolator 105 capacitor form a frequency matching section of device 102 (i.e., a series L-shunt-C match).

In an alternate embodiment, connection region 106 is coupled to an external ground (e.g., a circuit board ground plane) via leads, wires, or the like. In such a case, a connector 132 leading to ground plane 130 is optional.

While the illustrated embodiment relates to a particular type of ceramic package, it will be appreciated that the range of embodiments is not so limited. Air cavity packages of various types, plastic packages, metal packages, and any other suitable packaging technology may be used. In a particular embodiment, a plastic over-molded package is employed.

In the illustrated embodiment, the interdigitated wires 110 and 120 are substantially parallel. This parallel nature is depicted in the top view of FIG. 2. While the shape of particular wires may vary depending upon locations of bond pads, loop heights, etc., a wirebond array in accordance with one embodiment includes wires that have substantially the same profile. That is, as shown in FIG. 3, because package lead 104 and ground connection region 106 are relatively close and are substantially coplanar, the loop heights and overall shapes of the wires 110 and 120 are substantially the same.

With respect to a prior art system, one may double the number of wires in the array, with every other wire being connected at one end to a ground node. By using interdigitated ground wires 120, the ground plane 130 is effectively moved closer to the wirebond array (specifically, signal wires 110). This reduces the overall inductance of array 100. The equivalent inductance of the resulting wirebond array may, in some applications, be smaller than the equivalent inductance of a conventional wirebond array with the same number of total wires. It has been found that the benefit of the illustrated embodiment is greater for cases where the wires are located farther away from the ground plane 130.

Furthermore, the RF current distribution within array 100 is improved, as the tendency for the outer wires (wires $w_1$ and $w_n$) to carry more of the current is decreased. The illustrated wirebond array 100 provides an alternate return path for the current (i.e., in the adjacent wires), and forces the array to operate in a different mode of propagation (quasi-odd mode), resulting in more uniform current distribution. This uniform current distribution (and thus uniform temperature distribution) helps prevent excessive heating and non-symmetrical current flow through the peripheral wires.

The number, size, length, and shape of wires 110 and 120 may be selected in accordance with known design principles, depending upon the application. In one embodiment, for example, n ranges from 10 to 40 wires. In a particular embodiment, for example, 27 wires are used with a spacing, d, of about 250 μm (i.e., 14 signal wires and 13 ground wires). In another embodiment, 24 wires are used, with a spacing d, of about 75 μm. It will be appreciated, however, that the invention is not limited to a particular number of wires.

Wires 110, 120 consist of any suitable conductive material, e.g., gold, aluminum, copper, or any other conventional metallic alloy. Furthermore, the length and diameter of wires 110, 120 may be selected in accordance with known design principles (e.g., current requirements, inductance levels, etc.) The ends 111 and 113 of wires 110 and 120 may be connected to bonding areas on respective components and leads in any convenient matter (e.g., via ultrasonic, thermosonic, or any other conventional bonding method). Such wirebond techniques are well known in the art and thus need not be described herein. Additional details regarding wire bond techniques may be found in a number of standard references, including, for example, Seraphim et al., Principles of Electronic Packaging (1989).

While FIG. 3 depicts a power device 102 being interconnected with a package lead 104 (i.e., a package lead for a ceramic package), it will be appreciated that wirebond array 100 may be used to interconnect two devices, two leads, or any other pair of nodes, as may be appropriate in the application. In one embodiment, device 102 is a high power RF device operating at about 30 W and a frequency of about 3.3-3.8 GHz. In another embodiment, device 102 is a high power RF device operating at about 10 W and a frequency of about 5.9 to 6.4 GHz. In a particular embodiment, 14 signal wires and 13 ground wires are used (27 wires total), with a wire pitch of about 125 microns. In another embodiment, 12 signal wires and 12 ground wires are used (24 wires total) with a wire pitch of about 125 microns. Similar embodiments may also be used with lower frequency devices—for example, devices operating at approximately 450 MHz.

Figure 4:
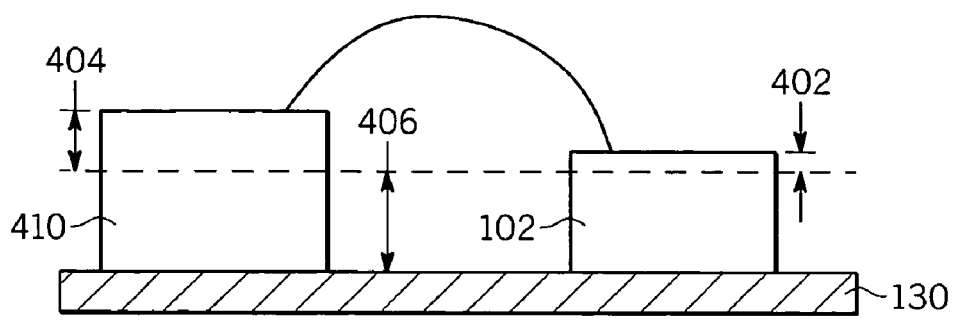
FIG. 4 is a side view of an alternate embodiment.
Figure 5:
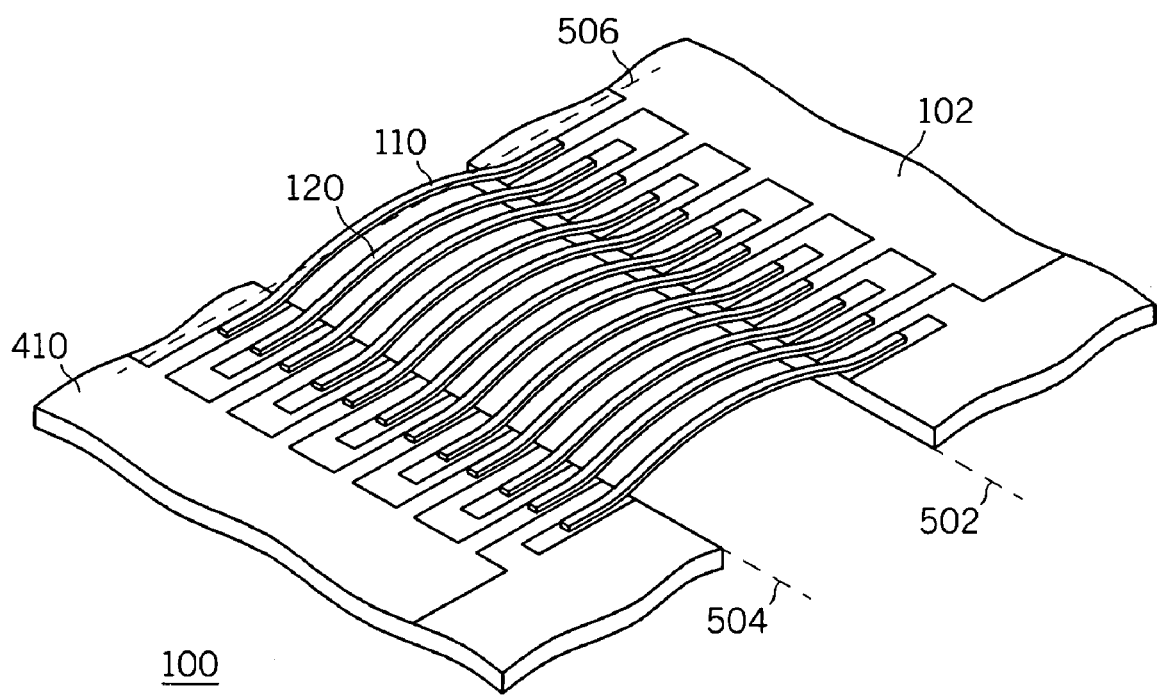
FIG. 5 is an isometric close-up view of the embodiment shown in FIG. 4.

In another embodiment, a semiconductor device is connected to an integrated passive device (or simply "passive device") such as a MOSCAP or the like. That is, referring to FIGS. 4 and 5, a semiconductor device 102 (e.g., a GaAs HFET) is interconnected to a passive device 410 (e.g., a GaAs passive device). Wirebond array 100 is bonded to the topside of device 102 and the topside of passive device 404. The system is defined by reference planes 502 and 504 (corresponding to the edges of device 102 and passive device 410, respectively), and symmetry plane 506. An offset from ground plane 130 is illustrated, as well as respective distances 402 and 404 of the topsides of device 102 and passive device 410. In this regard, it has been determined that the benefits of embodiments of the present invention (with respect to inductance and current uniformity) are greater as the distance 406 from the ground plane 130 increases.

In summary, what has been described is a wirebond array comprising a plurality of signal wires and a plurality of ground wires interdigitated with and substantially parallel to the set of signal wires. In one embodiment, each of the plurality of signal wires and ground wires is attached to a first semiconductor device (e.g., a microwave power device). In another, each of the plurality of signal wires is further attached to a package lead. In one embodiment, each of the plurality of ground wires is further attached to a ground connection region substantially coplanar with the package lead. Alternatively, each of the plurality of signal wires is further attached to a second semiconductor device, wherein each of the plurality of ground wires is further attached to the second semiconductor device.

In accordance with another embodiment, a method for forming an interconnect includes: providing a device package having a semiconductor device mounted thereon, wherein the device package includes a ground plane; forming a plurality of signal wires between the semiconductor device and the package lead; and forming a plurality of ground wires interdigitated with and substantially parallel to the plurality of signal wires, wherein the plurality of ground wires are coupled to the ground plane. The ground plane may be connected to a ground node external to the device package.

In one embodiment, forming the plurality of ground wires includes forming the ground wires between the semiconductor device and a ground connection region substantially coplanar with the package lead. In a particular embodiment, forming the signal wires includes forming from 10-20 signal wires, and forming the ground wires includes forming from 10-20 ground wires. In another embodiment, forming the ground wires includes forming the ground wires such that a distance between the interdigitated source and ground wires is between 50 and 500 μm.

In accordance with another embodiment, a microwave power device comprises: a package (e.g., a ceramic package) having a lead, a ground plane, and a ground connection region substantially coplanar with the lead; a microwave power transistor mounted to the package; a connector connecting the ground connection region to the ground plane; and a wirebond array comprising a plurality of signal wires and a plurality of ground wires interdigitated with and substantially parallel to the set of signal wires, wherein each of the plurality of ground wires is attached to the ground connection region and the microwave power transistor, and wherein each of the plurality of signal wires is attached to the lead and the microwave power transistor.

In a particular embodiment, the ceramic package includes a ceramic isolator, wherein the lead and ground connection region are mechanically coupled to the ceramic isolator. The ground connection region is preferably connected to the ground plane via a connector provided on the isolator. In one embodiment, the distance between the interdigitated source and ground wires is between 50 and 500 μm. In another, there are from 10-20 signal wires and 10-20 ground wires. The package may include a flange, in which case the ground plane may be adjacent to and substantially parallel to a portion of the flange. In one embodiment, the ground wires and the signal wires have substantially the same loop height and/or substantially the same shape.

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An apparatus that includes a wirebond array, the apparatus comprising:
    a ground plane having a top surface;
    a semiconductor device over a first portion of the top surface of the ground plane, wherein the semiconductor device includes a series of bond pads;
    an isolator over a second portion of the top surface of the ground plane, wherein the isolator has a top surface, a face extending perpendicular from the ground plane to the top surface of the isolator, and an edge between the top surface of the isolator and the face;
    a package lead on the top surface of the isolator;
    a ground connection region on the top surface of the isolator and extending along the edge, wherein the ground connection region is substantially coplanar with the package lead;
    a connector that electrically connects the ground connection region and the top surface of the ground plane, wherein the connector includes wrap-around metallization formed on the face of the isolator;
    a plurality of signal wires; and
    a plurality of ground wires interdigitated with and substantially parallel to the plurality of signal wires, wherein the plurality of signal wires and the plurality of ground wires have substantially the same loop heights so that the wirebond array operates as an impedance matching element,
    and wherein signal wires are attached at first ends of the signal wires to the package lead and at second ends of the signal wires to first bond pads of the series of bond pads, and the ground wires are attached at first ends of the ground wires to the ground connection region and at second ends to second bond pads of the series of bond pads, wherein the first bond pads and the second bond pads are different from each other.

2. The wirebond array of claim 1, wherein the first bond pads and the second bond pads are proximate to an edge of a semiconductor device.

3. The wirebond array of claim 2, wherein the semiconductor device is a power device.

4. The apparatus of claim 1, wherein the wrap-around metallization formed on the face of the isolator includes a refractory tungsten plated with Ni and Au.

5. The apparatus of claim 1, wherein the isolator comprises a ceramic window frame.

6. The apparatus of claim 1, wherein the apparatus further includes at least 10 signal wires and at least 10 ground wires, and the signal wires and ground wires are interdigitated in an alternating configuration.

7. A microwave power device comprising:
    a package having a lead, a ground plane, and a ground connection region substantially coplanar with the lead;
    a power transistor mounted over a first portion of the ground plane;
    an isolator over a second portion of the ground plane, wherein the isolator has a top surface, a face extending perpendicular from the ground plane to the top surface, and an edge between the top surface and the face, and wherein the lead and the ground connection region are coupled to the top surface of the isolator;
    a connector connecting the ground connection region to the ground plane, wherein the connector includes wrap-around metallization formed on the face of the isolator; and
    a wirebond array comprising a plurality of signal wires and a plurality of ground wires interdigitated with and substantially parallel to the plurality of signal wires, wherein the plurality of signal wires and the plurality of ground wires have substantially the same loop heights so that the wirebond array operates as an impedance matching element, and wherein each of the plurality of ground wires is attached at a first end of the ground wire to the ground connection region and at a second end of the ground wire to a first bond area proximate to an edge of the power transistor, and wherein each of the plurality of signal wires is attached at a first end of the signal wire to the lead and at a second end of the signal wire to a second bond area proximate to the edge of the power transistor.

8. The power device of claim 7, wherein the package is an air-cavity package.

9. The power device of claim 7, wherein the lead and ground connection region are mechanically coupled to the isolator so that the lead and the ground connection region are close together and are substantially coplanar with each other, and so that the lead and the ground connection region are raised above the ground plane.

10. The power device of claim 7, wherein the connector is provided on the isolator.

11. The power device of claim 7 wherein a distance between the interdigitated source and ground wires is between 50 and 500 µm.

12. The power device of claim 7, wherein the wirebond array includes from 10-20 signal wires and 10-20 ground wires.

13. The power device of claim 7, wherein the signal wires carry a signal having a frequency greater than 2.0 GHz.

14. The power device of claim 7, wherein the ground plane is connected to an external ground node.

15. The power device of claim 7, wherein the ground wires and the signal wires have substantially the same shape.

* * * * *